US006547076B1

United States Patent
Pylant

(10) Patent No.: US 6,547,076 B1
(45) Date of Patent: Apr. 15, 2003

(54) APPARATUS AND METHODS FOR IMPROVING UNIFORM COVER TAPE ADHESION ON A CARRIER TAPE

(75) Inventor: John D. Pylant, Fallbrook, CA (US)

(73) Assignee: Peak International Ltd., Fremont, CA (US)

( * ) Notice: Subject to any disclaimer, the term of this patent is extended or adjusted under 35 U.S.C. 154(b) by 0 days.

(21) Appl. No.: 10/050,909

(22) Filed: Jan. 14, 2002

Related U.S. Application Data

(63) Continuation of application No. 09/484,380, filed on Jan. 14, 2000, now abandoned.

(51) Int. Cl.[7] ............................................. B65D 85/00
(52) U.S. Cl. ................................................... 206/713
(58) Field of Search ........................ 206/713, 714–718, 206/722–725; 220/359.1, 359.4

(56) References Cited

U.S. PATENT DOCUMENTS

| | | | | |
|---|---|---|---|---|
| 4,605,007 A | * | 8/1986 | Heraly | 206/723 |
| 4,736,841 A | * | 4/1988 | Kaneko et al. | 206/714 |
| 5,152,393 A | * | 10/1992 | Chenoweth | 206/714 |
| 5,526,935 A | * | 6/1996 | Tidemann et al. | 206/713 |
| 6,467,627 B1 | * | 10/2002 | Troxtell, Jr. | 206/714 |

* cited by examiner

Primary Examiner—Luan K. Bui
(74) Attorney, Agent, or Firm—Pillsbury Winthrop LLP

(57) ABSTRACT

Apparatus and methods are presented herein for uniformly sealing and peeling a cover tape to/from a carrier tape. The carrier tapes of the present invention include surface transitions that minimize/eliminates surface irregularities and distortions such that the cover tapes can be uniformly sealed and peeled from the carrier tapes. The surface transitions act as physical barriers to prevent propagation of surface irregularities and distortions from the thermoformed pocket area into the heat bonding zones. The surface transitions also act as stiffening members to keep the heat bonding zones as flat as possible during subsequent handling of the carrier tape. The surface transitions may be in the form of continuous ribs and/or step portions.

8 Claims, 10 Drawing Sheets

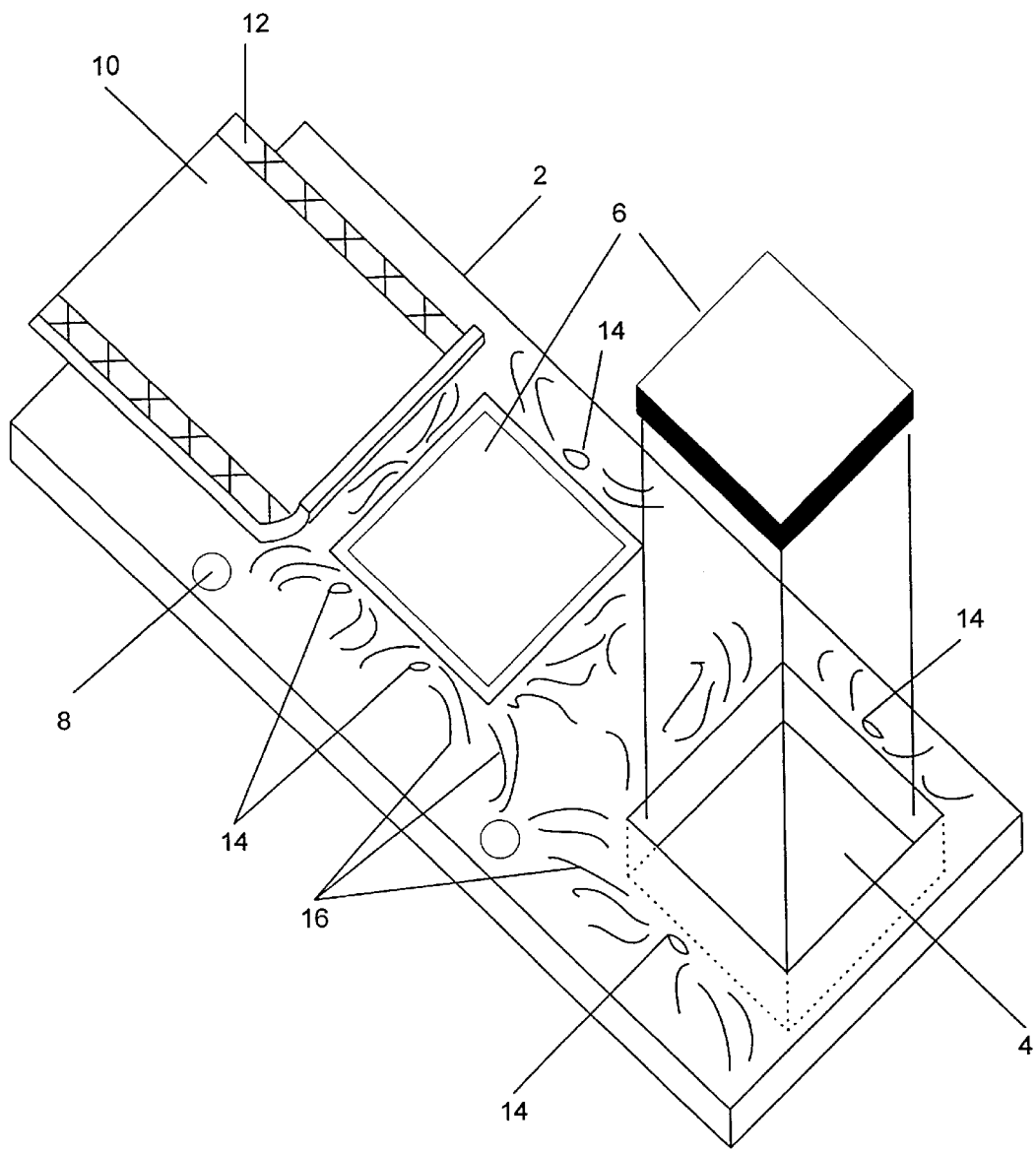
FIG. 1A (PRIOR ART) - PERSPECTIVE VIEW

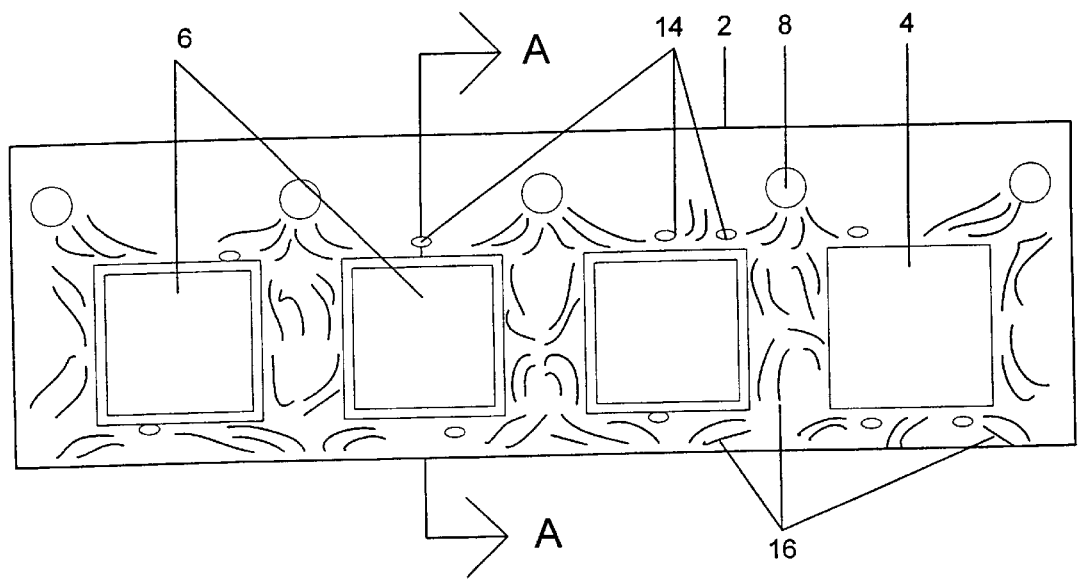
FIG. 1B (PRIOR ART) - TOP VIEW
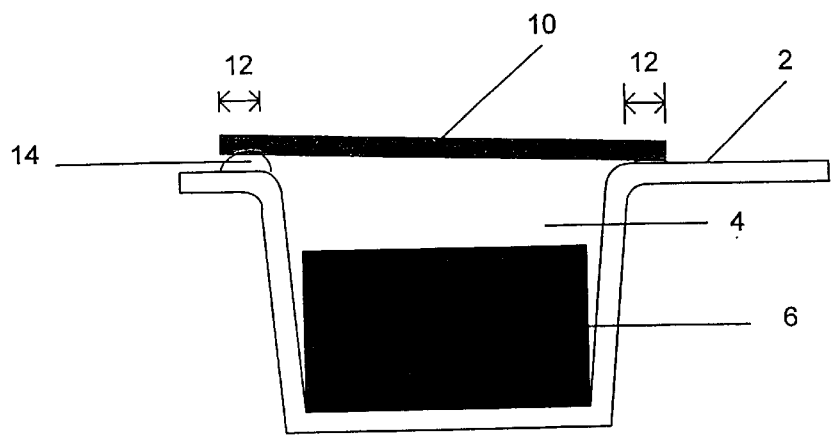
FIG. 1C (PRIOR ART) - SIDE VIEW

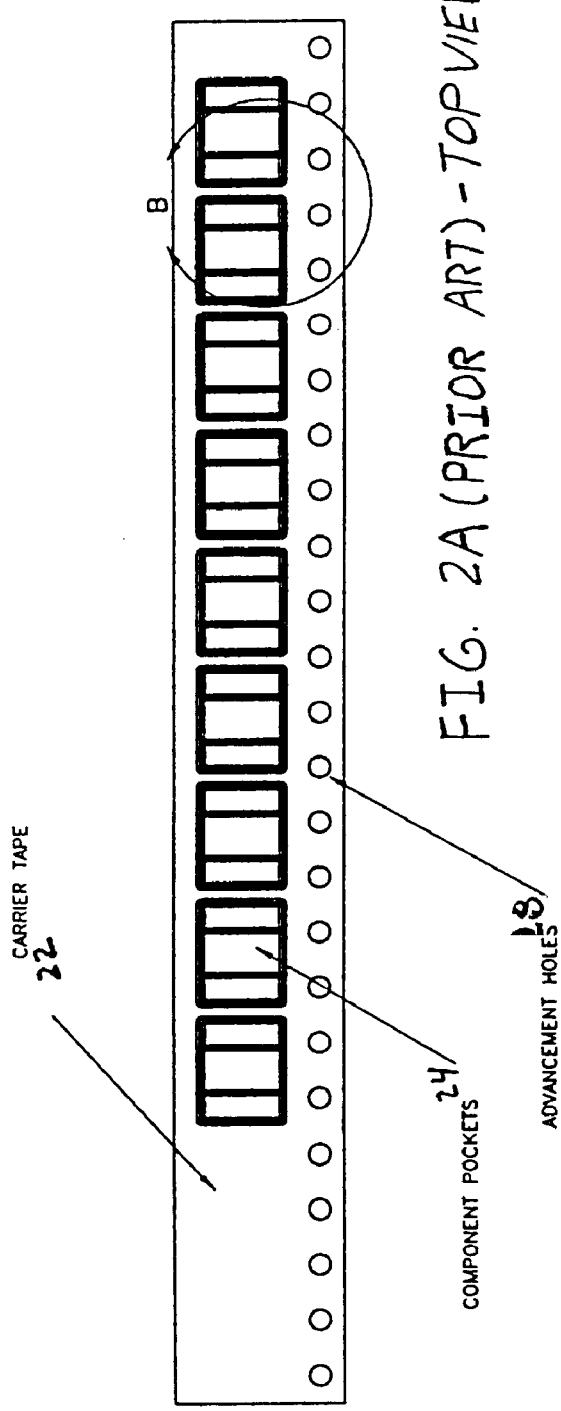
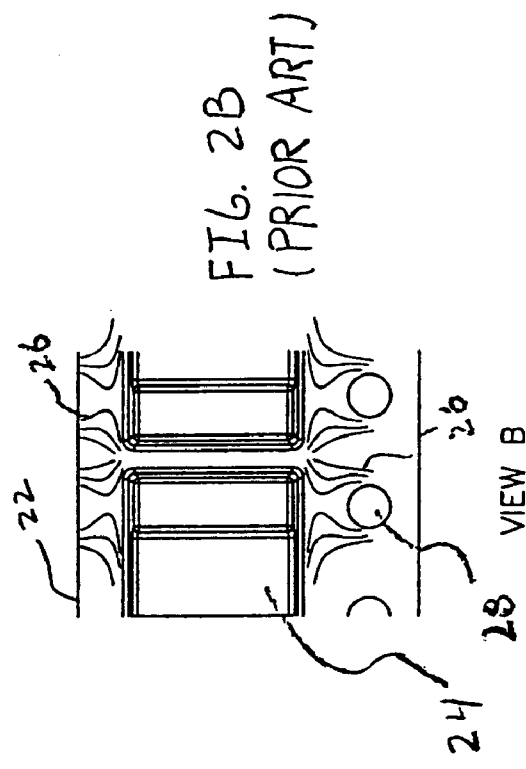

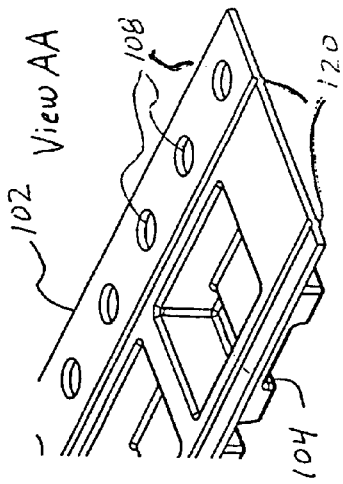
View AA
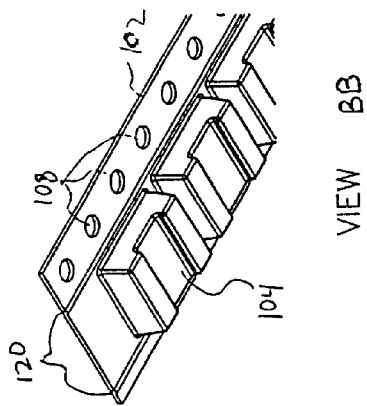
VIEW BB
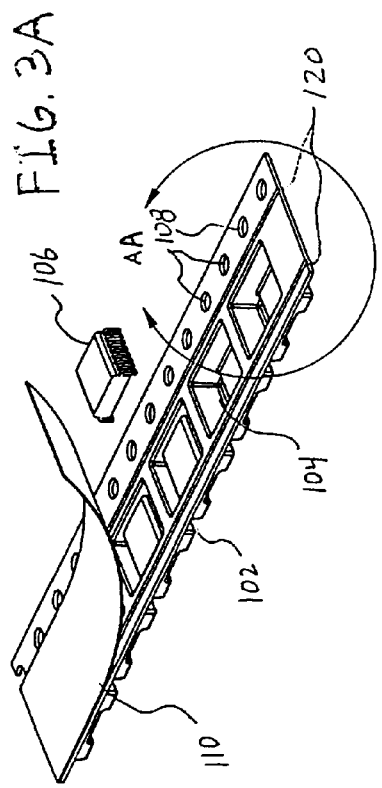
FIG. 3A
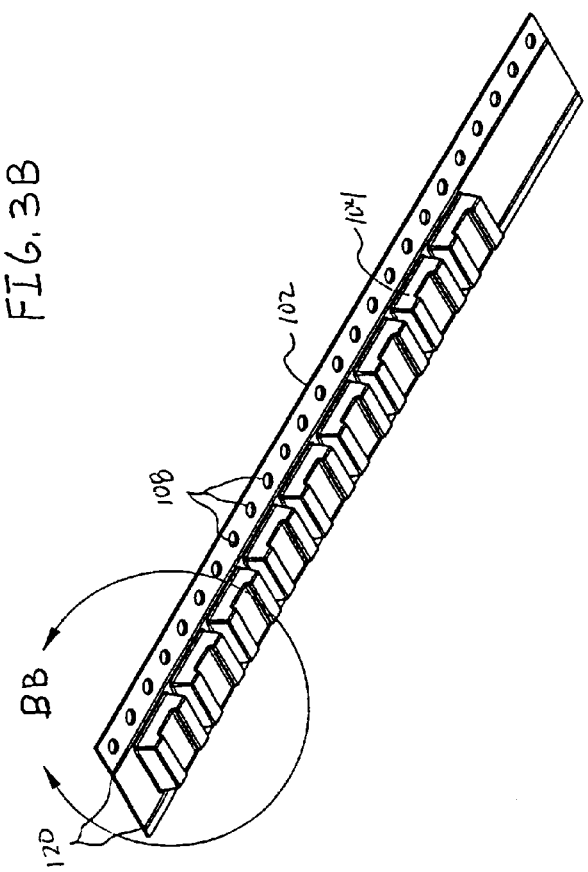
FIG. 3B

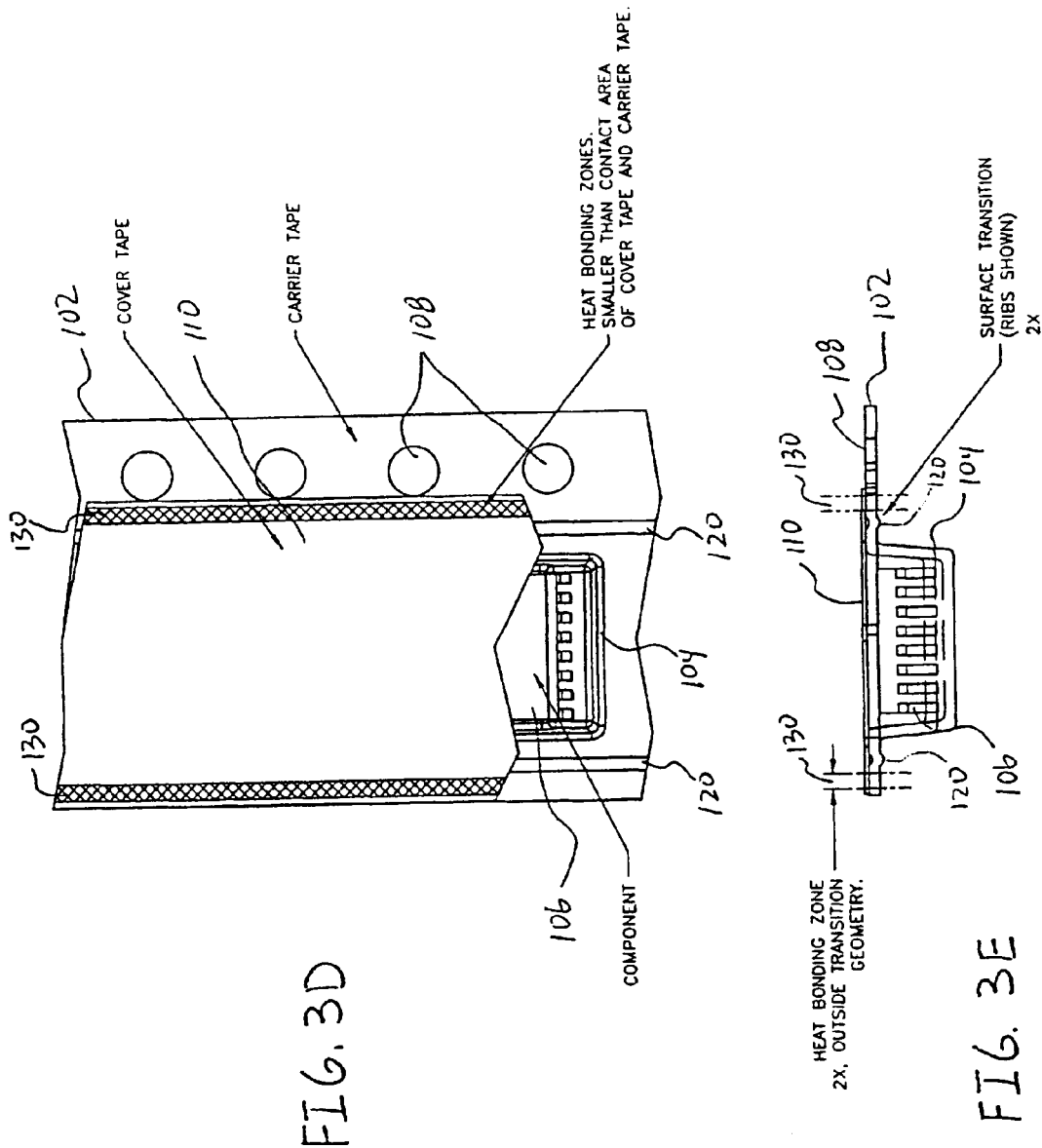

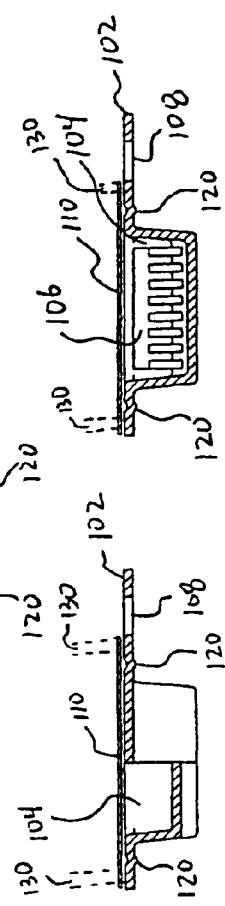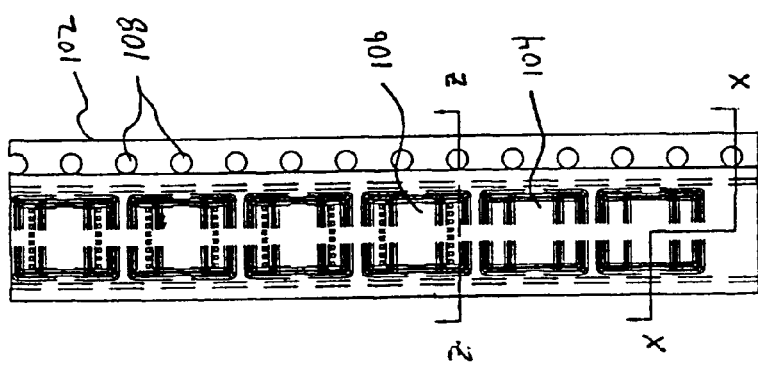

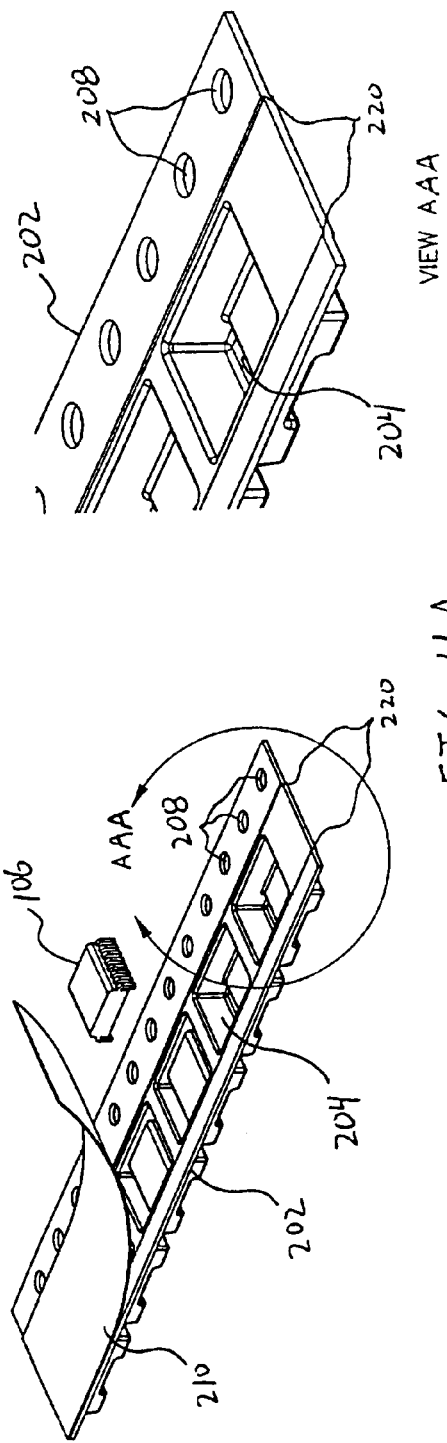
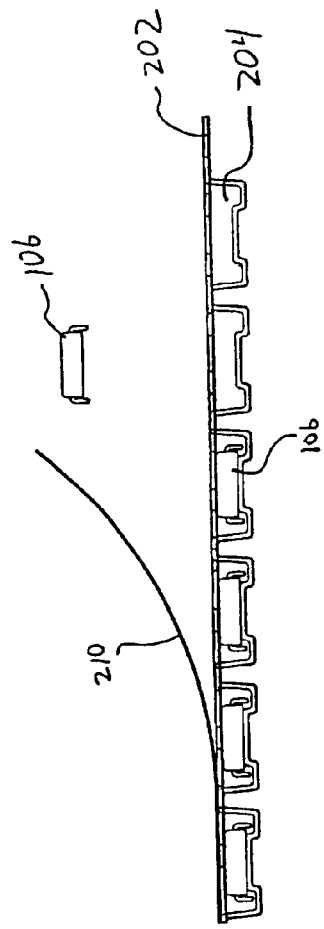
FIG. 4A
VIEW AAA
FIG. 4C

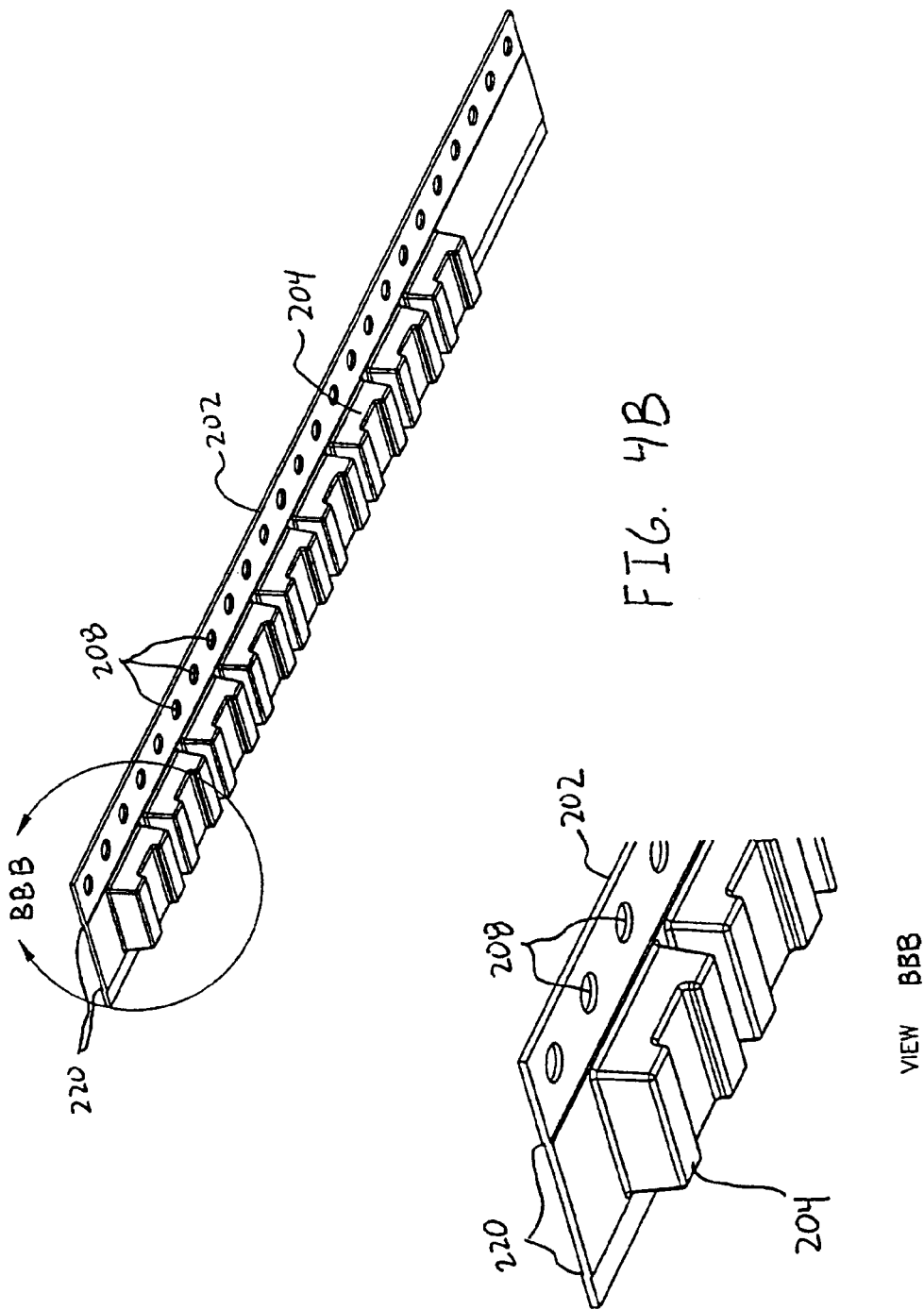

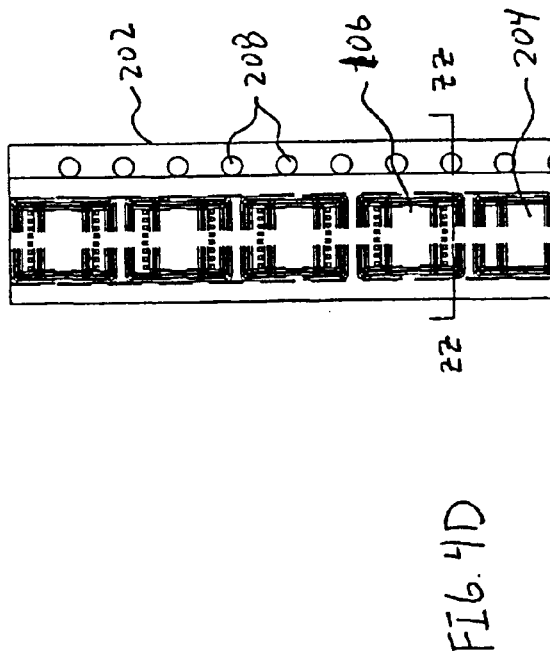
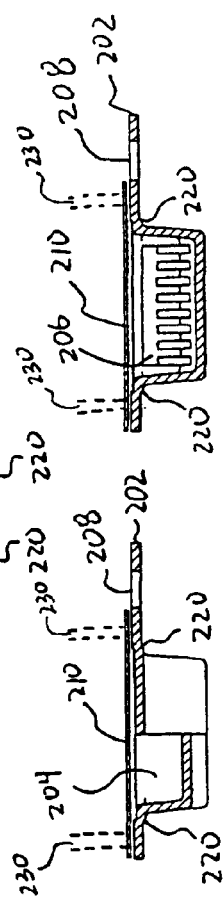

APPARATUS AND METHODS FOR IMPROVING UNIFORM COVER TAPE ADHESION ON A CARRIER TAPE

This is a continuation of application Ser. No. 09/484,380 filed Jan. 14, 2000.

FIELD OF THE INVENTION

The present invention relates to a carrier tape system used for packaging, transporting, and automatically taking out components that are placed in the pockets of a carrier tape. More particularly, the present invention is directed to apparatus and methods for uniformly sealing and peeling a cover tape that is used to protect the components placed in the pockets of the carrier tape. Furthermore, the present invention provides apparatus and methods for minimizing or eliminating surface irregularities and distortions on bonding zones of the carrier tape.

BACKGROUND OF THE INVENTION

Electronic components such as semiconductor chips, devices, integrated circuits, and the like are generally developed and manufactured by one manufacturer and transported to another manufacturer or customer for further processing. For example, after manufacturing semiconductor chips in a fabrication or "clean room" facility, the chips are generally packaged and transported to another manufacturer or customer, for example, a computer wholesaler, so that the wholesaler can mount them to printed circuit boards or the like.

When components are packaged and transported from one manufacturer to another, it is critical that the components be packaged and transported with minimal damage. By their very nature, small electronic components (e.g., semiconductor chips, devices, and integrated circuits) are light objects and susceptible to damage. Thus, it is important that these components be packaged and transported in a manner that minimizes/eliminates damage to them.

Currently, the semiconductor fabrication industry implements a JEDEC standard carrier tape system to package and transport semiconductor components. Conventional carrier tape systems allow the component manufacturers to package and transport the components to their customers with minimal damage while allowing the customers to efficiently unload the components using an automated pick and place machine.

FIGS. 1A–1C illustrate various views of a conventional carrier tape system. For example, FIG. 1A illustrates a perspective view, FIG. 1B illustrates a top view, and FIG. 1C illustrates a cutaway end view of a section taken along line A—A of the conventional carrier tape system. Reference will be made to FIGS. 1A–1C concurrently for a more complete understanding of the conventional system.

A conventional carrier tape 2 includes multiple thermoformed pockets 4 formed along its longitudinal direction for storing individual components 6. The carrier tape 2 also includes a row of advancement holes 8 formed longitudinally along one side of the carrier tape 2. The advancement holes 8 are used for locating and feeding the components 6 into the automated pick and place machine (not shown).

In conventional carrier tape systems, surface irregularities and distortions are typically formed on the top surface of the carrier tape 2. These surface irregularities and distortions have a significant influence on the uniformity of the bonding strength between the carrier tape 2 and the cover tape 10. Surface irregularities and distortions are generally formed on the carrier tape 2 as a result of thermoforming the pockets 4 or from subsequent handling of the carrier tape 2. Such surface irregularities and distortions may be in a form of small bumps 14 or grooves 16, which propagate out from or between the pockets 4.

During the packaging process, the components 6 are loaded into the pockets 4 of the carrier tape 2. After the components 6 are successfully loaded into the pockets 4, a cover tape 10 is applied over the pockets 4 using, for example, a sealing iron (not shown) to secure the components 6 contained therein. The cover tape 10 protects and retains the components 6 in the pockets 4 of the carrier tape 2. In general, the cover tape 10 is heat bonded over the carrier tape 2 along a pair of bonding portions 12. In other words, only the outer portions (corresponding to bonding portions 12) of the cover tape 10 are heat bonded to the carrier tape 2 along the longitudinal direction.

After sealing the pockets 4 of the carrier tape 2 with the cover tape 10, the components 6 are transported to another manufacturer/customer. After receiving the carrier tape 2, it is fed into the pick and place machine along its longitudinal direction using advancement holes 8. The cover tape 10 is simultaneously peeled/removed from the carrier tape 2. Thereafter, the components 6 in the pockets 4 of the carrier tape 2 are taken out and mounted to printed circuit boards or the like.

An important consideration using the heat bonding process as described above is that the cover tape 10 must be peeled back from the carrier tape 2 with a uniform amount of force before the components 6 are taken out of the pockets 4. In other words, while separating the cover tape 10 from the carrier tape 2, the force required for such separation should be constant with respect to the longitudinal direction of the carrier tape 2. However, because of surface irregularities and distortions, the required separation force may not be constant. For example, a greater force may be required to separate the cover tape 10 from the carrier tape 4 where there are "high spots" (i.e., bump 14 of FIG. 1C) and a smaller force may be required in regions where there are lower spots. As a result, the force needed to separate/peel the cover tape 10 from the carrier tape 2 may not be uniform from one region to another. Undulations may result in the carrier tape 2 as the cover tape 10 is separated/peeled. Such undulations may undesirably separate the components 6 from the pockets 4 of the carrier tape 2 or change the placement of the components 6, thereby leading to obstructions in using the automated pick and place machine.

Small surface irregularities and distortions as described above can cause differences in contact pressure during the heat bonding process. As the cover tape 10 is sealed to the carrier tape 2 on the bonding portions 12, "high spots" will tend to bond better than lower spots, thereby causing variations in the bonding strength. Achieving uniform release tension is often very difficult when such variations in the bonding strength exists and continues to be a major problem in the carrier tape industry.

FIG. 2A illustrates a top view and FIG. 2B illustrates an exploded top view of a section of another conventional carrier tape. Similar to the carrier tape 2 of FIGS. 1A–1C, the carrier tape 22 includes multiple thermoformed pockets 24 for storing components and advancements holes 28 for the automated pick and place machine. As shown in more detail, surface distortions 26 are formed on the carrier tape 22 from thermoforming the pockets 24 and/or subsequent handling the carrier tape 22. Such distortions 26 propagate to the heat bonding portions, thereby requiring variations in the force needed to remove the cover tape from the carrier tape 22.

The carrier tape is made generally made from, but not limited to, thermoplastic resin, polystyrene or ABS (acrylonitrile butadiene-styrene) with or without additives, and the cover tape is made from, but not limited to, polyester, polypropylene or polyethylene having heat sensitive adhesives with or without additives.

U.S. Pat. No 4,736,841 ('841 patent) also discloses various examples of other prior art carrier tape systems. One particular embodiment in the '841 patent includes a carrier tape that has a pair of step portions extending longitudinally along opposite sides of the carrier tape. The raised portions of the carrier tape are used as bonding portions to heat bond the cover tape thereto, where the step portions are also used as boundaries for applying the cover tape. Consequently, a recessed center portion is prevented from making contact with the cover tape as the step portions are used as physical boundaries. Thus, in this particular prior art embodiment, the boundaries of each of the bonding portions are defined by the step portions, which extend longitudinally along the carrier tape. In addition, the '841 patent does not address the problem of minimizing/eliminating surface irregularities and distortions in the bonding portions/zones of the carrier tape.

SUMMARY OF THE INVENTION

It is an object of the present invention to provide apparatus and methods for improving adhesion between a carrier tape and a cover tape.

It is another object of the present invention to provide apparatus and methods for providing a more uniform sealing and peeling process between a cover tape and a carrier tape.

It is a further object of the present invention to provide apparatus and methods for minimizing/eliminating surface irregularities and distortions from the bonding portions/zones of a carrier tape.

It is yet another object of the present invention to provide apparatus and methods for improving cover tape bond strength uniformity.

It is another object of the present invention to provide a carrier tape having surface transitions along each longitudinal side to minimize/eliminate surface irregularities and distortions on the bonding portions/zones of the carrier tape.

The present invention relates to apparatus and methods for sealing and peeling a cover tape from a carrier tape in a uniform manner. The carrier tapes of the present invention include surface transitions that minimizes/eliminates the presence of surface irregularities and distortions on the carrier tape such that the cover tape can be uniformly applied and removed to/from the carrier tape. These surface transitions are used to improve bond strength uniformity between the cover tape and the carrier tape.

Apparatus and methods for minimizing/eliminating the presence of surface irregularities and distortions in bonding zones of the carrier tape is achieved by adding surface transitions along each longitudinal side of the carrier tape. This can be accomplished by adding a pair of continuous ribs or step portions between the pockets and the heat bonding zones. In other embodiments, there can be more than two surface transitions on the carrier tape (i.e., four continuous ribs, two continuous ribs on each side of the carrier tape extending longitudinally. The surface transitions act as physical barriers to prevent propagation of surface irregularities and distortions from the thermoformed pocket area to the heat bonding zones. In addition, the surface transitions also act as stiffening members to help keep the heat bonding zones as flat as possible during subsequent handling of the carrier tape.

BRIEF DESCRIPTION OF THE DRAWINGS

These and other objects and advantages of the present invention will become apparent and more readily appreciated from the following detailed description of the presently preferred exemplary embodiments of the invention taken in conjunction with the accompanying drawings, of which:

FIG. 1A illustrates a perspective view of a conventional carrier tape system;

FIG. 1B illustrates a top view of a conventional carrier tape system as shown in FIG. 1A;

FIG. 1C illustrates a cutaway end view of a conventional carrier system as shown in FIG. 1A;

FIG. 2A illustrates a top view of another conventional carrier tape;

FIG. 2B illustrates an exploded top view of a section of the conventional carrier tape of FIG. 2A;

FIG. 3A illustrates a top perspective view of a carrier tape and cover tape in accordance with the first preferred embodiment of the present invention;

FIG. 3B illustrates a bottom perspective view of a carrier tape in accordance with the first preferred embodiment of the present invention;

FIG. 3D illustrates a cutaway top view of a carrier tape and cover tape in accordance with the first preferred embodiment of the present invention;

FIG. 3E illustrates a cutaway end view of a section of a carrier tape and cover tape in accordance with the first preferred embodiment of the present invention;

FIG. 3F illustrates another top view of a carrier tape and cover tape in accordance with the first preferred embodiment of the present invention;

FIG. 3G illustrates a cutaway end view of a cross section taken along line X—X of FIG. 3F;

FIG. 3H illustrates a cutaway end view of a cross section taken along line Z—Z of FIG. 3F;

FIG. 4A illustrates a top perspective view of a carrier tape and cover tape in accordance with the second preferred embodiment of the present invention;

FIG. 4B illustrates a bottom perspective view of a carrier tape in accordance with the second preferred embodiment of the present invention;

FIG. 4C illustrates a side view of a carrier tape and cover tape in accordance with the second preferred embodiment of the present invention;

FIG. 4D illustrates a top view of a carrier tape and cover tape in accordance with the second preferred embodiment of the present invention;

FIG. 4E illustrates a cutaway end view of a cross section taken along line XX—XX of FIG. 4D; and FIG. 4F illustrates a cutaway end view of a cross section taken along line ZZ—ZZ of FIG. 4D.

DETAILED DESCRIPTION OF THE PREFERRED EMBODIMENTS

Figure 3C:
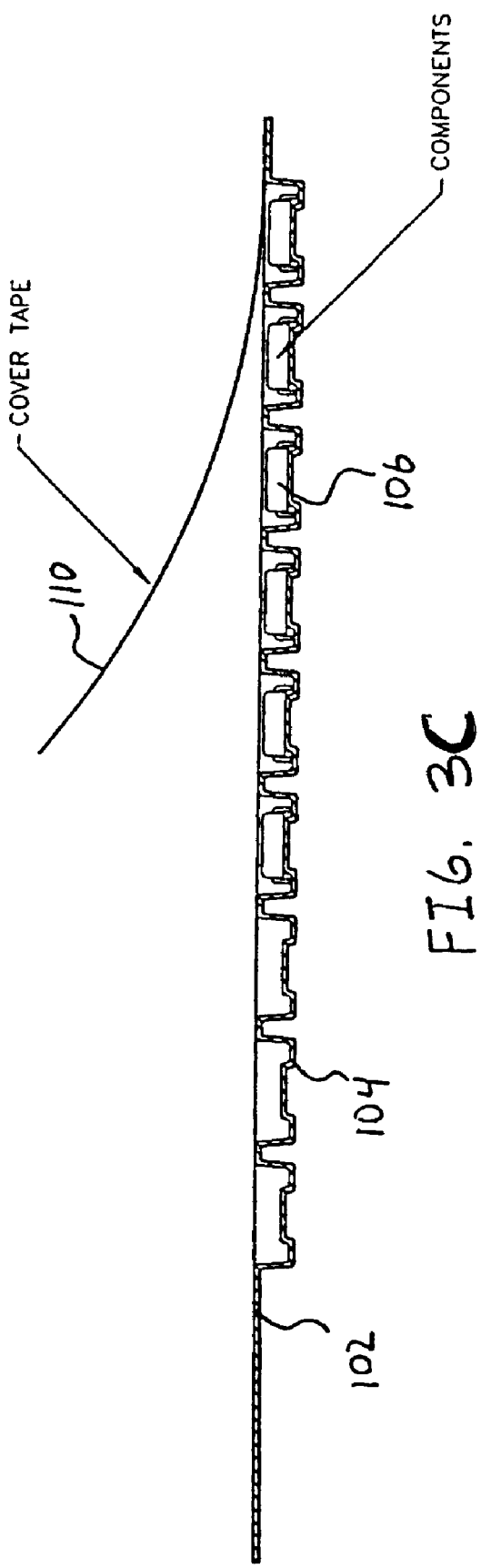
FIG. 3C illustrates a side view of a carrier tape and cover tape in accordance with the first preferred embodiment of the present invention.

The present invention will be described in greater detail, which may serve to further the understanding of the preferred embodiments of the present invention. As described elsewhere herein, various refinements and substitutions of the various embodiments are possible based on the principles and teachings herein.

The preferred embodiments of the present invention will now be described with reference to FIGS. 3–4, wherein like components are designated by like reference numerals throughout the various figures. Further, specific details and parameters are provided herein, and are intended to be explanatory rather than limiting.

The present invention discloses apparatus and methods for minimizing and/or eliminating surface irregularities and distortions on a carrier tape, particularly in the bonding portions/zones of the carrier tape. Surface transitions are formed longitudinally on the sides of the carrier tape, thereby preventing surface irregularities and distortions from being formed on the bonding portions/zones. In one embodiment of the present invention, surface transitions include a pair of continuous ribs that are formed along the longitudinal sides of the carrier tape. In another embodiment of the present invention, a pair of step portions are formed along the longitudinal sides of the carrier tape. In both embodiments, surface irregularities and distortions are minimized/eliminated in the bonding zones of the carrier tape.

FIGS. 3A–3H illustrate a first preferred embodiment of the present invention. FIG. 3A illustrates a perspective top view, FIG. 3B illustrates a perspective bottom view, and FIG. 3C illustrates a side view of a carrier tape 102 and cover tape 110 in accordance with the first preferred embodiment. The carrier tape 102 includes multiple thermoformed pockets 104 for storing and transporting the components 106. Although each pocket 104 generally stores and transports one such component 106, in other embodiments, each pocket 104 can store and transport two or more components 106. Along the longitudinal direction of the carrier tape 102, there are also formed advancement holes 108. As described in the background section, these advancement holes 108 are used by an automated pick and place machine in order to pick up the components 106 from/into the pockets 104.

The carrier tape 102 further includes a pair of continuous ribs 120 where each continuous rib extends longitudinally along two sides of the carrier tape 102. When such ribs 120 are present, surface irregularities and distortions are minimized/eliminated in the bonding zones of the carrier tape, as described in more detail later herein.

FIG. 3D illustrates a cutaway top view and FIG. 3E illustrates a cutaway end view of a section of a carrier tape 102 and cover tape 110 in accordance with the first preferred embodiment of the present invention. The cover tape 110 is heat bonded to the carrier tape 102 along the heat bonding zones 130 (i.e., crossed-hatched area) using a conventional iron (not shown). Each of the two continuous ribs 120 is formed and extends longitudinally in between the pockets 104 and the heat bonding zones 130. The continuous ribs 120 may be formed having indents (spoon-like configuration) facing upwards, as shown in FIGS. 3A–3H, or in the alternative, continuous ribs may be formed such that the indents are facing downwards. In other words, the continuous ribs 120 as shown in FIGS. 3A–3H can be "flipped" 180 degrees such that the indents are facing downwards, instead of upwards.

When surface irregularities and distortions are formed on the carrier tape 102, the continuous ribs 120 acts as physical barriers by preventing these surface irregularities and distortions from spreading to the bonding zones 130. In this manner, the surface irregularities and distortions are contained within the center portion of the carrier tape 102. It is also noteworthy to note that the bonding zones 130 are typically narrower than the contact area between the cover tape 110 and carrier tape 102. Further, the surface transitions in this invention do not act as physical borders of the bonding zones, as distinguished from the embodiment described above relating to the '841 patent.

FIG. 3F illustrates another top view of a carrier tape 102 in accordance with the first preferred embodiment of the present invention. FIG. 3F is illustrated herein to further show cutaway cross sectional views taken along lines Z—Z and X—X for a more complete understanding of the present invention. For example, FIG. 3G and FIG. 3H illustrate cutaway end views of cross sections taken along lines X—X and lines Z—Z, respectively. Again, the continuous ribs 120 are formed in between the pockets 104 and the bonding zones 130.

In other embodiments, more than two continuous ribs (i.e., four, five, six, etc.) may be used as surface transitions on the carrier tape to prevent surface irregularities and distortions from forming on the bonding zones. For example, two pairs of continuous ribs, for a total of four continuous ribs, may be formed on the carrier tape. In this manner, one pair of continuous ribs may be formed longitudinally along one side of the carrier tape, while another pair of continuous ribs may be formed on the other side of the carrier tape.

FIGS. 4A–4F illustrate a second preferred embodiment of the present invention. FIG. 4A illustrates a perspective top view, FIG. 4B illustrates a perspective bottom view, and FIG. 4C illustrates a side view of a carrier tape 202 and cover tape 210 in accordance with the second preferred embodiment. Again, the carrier tape 202 includes advancement holes 208 and multiple pockets 204 for storing and transporting the components 106.

In the second embodiment of the invention, the carrier tape 202 includes a pair of step portions 220, as opposed to ribs 120, extending longitudinally along the two sides of the carrier tape. When such step portions 220 are used, surface irregularities and distortions are minimized/eliminated in the bonding zones of the carrier tape in a manner similar to that described above.

FIG. 4D illustrates a top view of the carrier tape and cover tape in accordance with the second preferred embodiment of the present invention. Referring to FIG. 4D, cutaway cross sectional views taken along lines XX—XX and ZZ—ZZ are illustrated in FIGS. 4E and 4F, respectively, for a more complete understanding of the present invention.

Again, in other embodiments, more than two step portions may be used as surface transitions on the carrier tape to prevent surface irregularities and distortions from forming on the bonding zones, similar to that described above relating to continuous ribs. Furthermore, the present invention contemplates using both continuous ribs and step portions on a single carrier tape to achieve the results described above. For example, one continuous rib can be formed longitudinally along one side of the carrier tape, and one step portion can be formed longitudinally along the other side of the carrier tape. In this manner, both the continuous rib and step portion are used to prevent surface irregularities and distortions from forming on the bonding zones.

It is to be understood that in the foregoing discussion and appended claims, the term "components" include any electronic or non-electronic components such as integrated circuits, memory chips, or semiconductor devices, etc.

In the previous descriptions, numerous specific details are set forth to provide a thorough understanding of the present invention. However, as one having ordinary skill in the art would recognize, the present invention can be practiced without resorting to the details specifically set forth.

Although various preferred embodiments have been described in detail above, those skilled in the art will readily appreciate that many modifications of the exemplary embodiments are possible without materially departing from the novel teachings and advantages of this invention.

I claim:

1. An apparatus for storing a plurality of components, comprising:
   a carrier tape having:
      a plurality of pockets adapted to receive the plurality of components, the plurality of pockets being formed along a longitudinal direction of the carrier tape;
      a pair of bonding zones, each bonding zone formed longitudinally along the outer periphery of the carrier tape;
      a pair of continuous ribs formed along the longitudinal direction of the carrier tape, wherein each of the pair of continuous ribs is formed in between the plurality of pockets and one of the pair of bonding zones; and
   a cover tape adapted to cover the plurality of pockets and bonded to the carrier tape at the pair of bonding zones such that the plurality of components are retained therein.

2. The apparatus according to claim 1, wherein the carrier tape further comprises a plurality of advancement holes formed longitudinally adjacent to one of the pair of bonding zones.

3. The apparatus according to claim 1, wherein the pair of continuous ribs is adapted to prevent surface distortions from forming on the bonding zones.

4. The apparatus according to claim 1, wherein the plurality of components comprises one of semiconductor chips, devices, and integrated circuits.

5. The apparatus according to claim 1, wherein the carrier tape is made from one of thermoplastic resin, polystyrene, and ABS.

6. The apparatus according to claim 1, wherein the cover tape is made from one of polyester, polypropylene, and polyethylene.

7. The apparatus according to claim 1, wherein the carrier tape further includes a second pair of continuous ribs, each of the second pair of continuous ribs extending longitudinally adjacent to one or the original pair of continuous ribs.

8. The apparatus according to claim 1, wherein the cover tape is heat bonded to the carrier tape at the pair of bonding zones.

* * * * *

UNITED STATES PATENT AND TRADEMARK OFFICE
CERTIFICATE OF CORRECTION

PATENT NO.    : 6,547,076 B1
DATED         : April 15, 2003
INVENTOR(S)   : John D. Pylant It is certified that error appears in the above-identified patent and that said Letters Patent is hereby corrected as shown below:

<u>Title page,</u>
Item [63], should read:
-- Continuation of application No. 09/484,380 filed on Jan. 14, 2000, now Pat. 6,568,535 issued 05/27/2003. --

Signed and Sealed this

Second Day of September, 2003

JAMES E. ROGAN
*Director of the United States Patent and Trademark Office*